US010193194B2

(12) United States Patent
Nakatsuka et al.

(10) Patent No.: US 10,193,194 B2
(45) Date of Patent: Jan. 29, 2019

(54) BATTERY ASSEMBLY CONTROLLER WHICH MONITORS VOLTAGES OF SECONDARY BATTERIES

(71) Applicant: Panasonic Intellectual Property Management Co., Ltd., Osaka (JP)

(72) Inventors: Junji Nakatsuka, Tokyo (JP); Gorou Mori, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 390 days.

(21) Appl. No.: 15/049,811

(22) Filed: Feb. 22, 2016

(65) Prior Publication Data

US 2016/0172717 A1 Jun. 16, 2016

Related U.S. Application Data

(63) Continuation of application No. PCT/JP2014/002496, filed on May 12, 2014.

(30) Foreign Application Priority Data

Aug. 29, 2013 (JP) ................................ 2013-178201

(51) Int. Cl.
*H01M 10/46* (2006.01)
*H01M 10/42* (2006.01)
(Continued)

(52) U.S. Cl.
CPC ..... *H01M 10/4257* (2013.01); *B60L 11/1853* (2013.01); *B60L 11/1866* (2013.01);
(Continued)

(58) Field of Classification Search
CPC ...... H02J 7/0014; H02J 7/0018; H02J 7/0019; H02J 7/0026; H02J 7/0021
(Continued)

(56) References Cited

U.S. PATENT DOCUMENTS 6,362,627 B1 3/2002 Shimamoto et al.
7,417,438 B2 8/2008 Miyamoto
(Continued)

FOREIGN PATENT DOCUMENTS

JP H11-248755 A 9/1999
JP 2003-114243 A 4/2003
(Continued)

OTHER PUBLICATIONS

Machine translation of JP 2010-183766 (dated Aug. 19, 2010).*
(Continued)

*Primary Examiner* — Edward Tso
(74) *Attorney, Agent, or Firm* — McDermott Will & Emery LLP

(57) ABSTRACT

A battery assembly controller controls terminal voltages of a plurality of series-connected secondary batteries to be equal. The controller includes a discharge circuit selectively reducing the terminal voltages of the secondary batteries; and a monitoring circuit directly connected to positive and negative electrodes of the secondary batteries to monitor the terminal voltages of the secondary batteries.

10 Claims, 12 Drawing Sheets

(51) Int. Cl.
*H02J 7/02* (2016.01)
*G01R 31/36* (2006.01)
*H01M 10/44* (2006.01)
*H01M 10/48* (2006.01)
*H02J 7/00* (2006.01)
*B60L 11/18* (2006.01)

(52) U.S. Cl.
CPC ...... *G01R 31/3658* (2013.01); *H01M 10/425* (2013.01); *H01M 10/441* (2013.01); *H01M 10/482* (2013.01); *H02J 7/0019* (2013.01); *H02J 7/0021* (2013.01); *H02J 7/0063* (2013.01); *H02J 7/0081* (2013.01); *H02J 7/02* (2013.01); *B60L 2240/547* (2013.01); *H01M 2010/4271* (2013.01); *H01M 2010/4278* (2013.01); *H02J 2007/0067* (2013.01); *Y02T 10/7005* (2013.01); *Y02T 10/7055* (2013.01); *Y02T 10/7061* (2013.01)

(58) Field of Classification Search
USPC ................. 320/116, 117, 118, 128, 134, 136
See application file for complete search history.

(56) References Cited

U.S. PATENT DOCUMENTS

| | | | |
|---|---|---|---|
| 2004/0036446 A1 | 2/2004 | Iwashima | |
| 2006/0125447 A1 | 6/2006 | Sugimoto | |
| 2009/0167248 A1 | 7/2009 | Murao et al. | |
| 2009/0309545 A1 | 12/2009 | Kunimitsu | |
| 2011/0011653 A1 | 1/2011 | Mizutani et al. | |
| 2013/0187612 A1* | 7/2013 | Aiura .................. | H01M 10/425 320/118 |
| 2014/0152261 A1* | 6/2014 | Yamauchi ........... | B60L 11/1866 320/118 |

FOREIGN PATENT DOCUMENTS

| | | |
|---|---|---|
| JP | 2004-104989 A | 4/2004 |
| JP | 2006-164882 A | 6/2006 |
| JP | 2009-159794 A | 7/2009 |
| JP | 2010-025925 A | 2/2010 |
| JP | 2010-183766 A | 8/2010 |
| JP | 2011-041452 A | 2/2011 |
| JP | 2011-250609 A | 12/2011 |
| JP | 2012-137334 A | 7/2012 |
| JP | 2013-027274 A | 2/2013 |
| WO | 2011/043311 A1 | 4/2011 |
| WO | 2013/056093 A1 | 4/2013 |

OTHER PUBLICATIONS

International Search Report dated Jul. 29, 2014 issued in corresponding International Application No. PCT/JP2014/002496. (w/ partial English translation).

* cited by examiner

BATTERY ASSEMBLY CONTROLLER WHICH MONITORS VOLTAGES OF SECONDARY BATTERIES

CROSS-REFERENCE TO RELATED APPLICATIONS

This is a continuation of International Application No. PCT/JP2014/002496 filed on May 12, 2014, which claims priority to Japanese Patent Application No. 2013-178201 filed on Aug. 29, 2013. The entire disclosures of these applications are incorporated by reference herein.

BACKGROUND

The present disclosure relates to battery assembly controllers controlling terminal voltages of a plurality of series-connected secondary batteries to be equal.

Battery assemblies formed by connecting a plurality of secondary batteries in series are known. In a battery assembly, if manufacturing differences or temperature differences of secondary batteries cause inequality in the energy stored in the secondary batteries, terminal voltages of the secondary batteries become unequal and are not charged or discharged efficiently as a battery assembly. Thus, a battery assembly controller that always monitors the voltages of secondary batteries and controls discharge to equalize the voltages of the secondary batteries is needed.

Each of Japanese Unexamined Patent Publication Nos. 2012-137334 and 2011-250609 discloses a typical battery assembly controller.

SUMMARY

The battery assembly controller of Japanese Unexamined Patent Publication No. 2012-137334 includes a resistor on a path shared by a discharge circuit and a monitoring circuit. Thus, a discharge current causes voltage drop at the resistor such that the monitoring circuit cannot measure the voltages of secondary batteries accurately.

The present disclosure provides a battery assembly controller controlling terminal voltages of a plurality of series-connected secondary batteries to be equal. The controller includes a discharge circuit selectively reducing the terminal voltages of the secondary batteries; and a monitoring circuit directly connected to positive and negative electrodes of the secondary batteries to monitor the terminal voltages of the secondary batteries.

According to the present disclosure, the monitoring circuit is directly connected to the positive and negative electrodes of the secondary batteries. This leads to accurate measurement of the terminal voltages of the secondary batteries and accurate equalization of the voltages of the secondary batteries.

DETAILED DESCRIPTION

Now, embodiments will be described in detail with reference to the drawings.

First Embodiment

Figure 1:
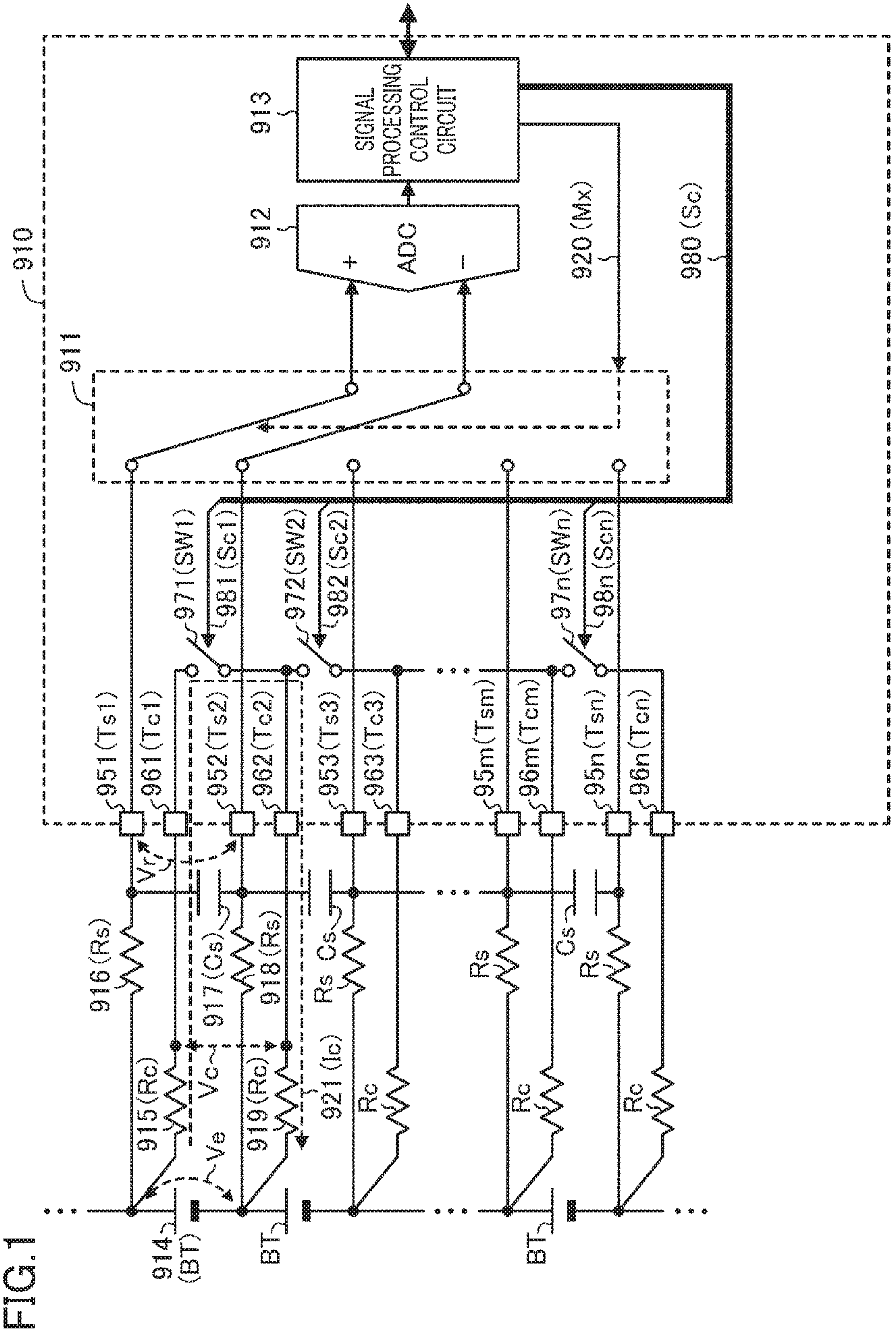
FIG. 1 is a circuit diagram of a battery assembly controller according to a first embodiment.

FIG. 1 is a circuit diagram of a battery assembly controller according to a first embodiment. In FIG. 1, one of secondary batteries (BT) 914 has a secondary battery voltage Ve as electromotive force. The secondary battery (BT) 914 includes a positive electrode connected or coupled to a cell balancing resistor (Rc) 915, and a negative electrode connected or coupled to a cell balancing resistor (Rc) 919. A cell balancing switch (SW1) 971 is turned on to discharge stored energy, thereby reducing the voltage Ve of the secondary battery (BT) 914. At this time, a potential difference between the cell balancing resistors (Rc) 915 and 919 is referred to as a cell balancing voltage Vc. A current flowing from the cell balancing resistor (Rc) 915 through the cell balancing switch (SW1) 971 to the cell balancing resistor (Rc) 919 is referred to as a cell balancing current (Ic) 921.

Furthermore, the positive electrode of the secondary battery (BT) 914 is directly connected to a voltage detection resistor (Rs) 916. The negative electrode of the secondary battery (BT) 914 is directly connected to a voltage detection resistor (Rs) 918. A voltage detection capacitor (Cs) 917 is connected or coupled to between the other terminals of the voltage detection resistors (Rs) 916 and 918 to form a low-pass filter. A detected voltage Vr, which has been stabilized by this low-pass filter, is measured by an analog-to-digital converter (ADC) 912 via a multiplexer (MUX) 911, and analyzed by a signal processing control circuit 913. As a result, the voltage Ve of the secondary battery (BT) 914 is measured. Note that a DC current flowing from the voltage detection resistor (Rs) 916 through the voltage detection capacitor (Cs) 917 to the voltage detection resistor (Rs) 918 is zero.

All of these elements are placed in each of the secondary batteries BT. Where n is an integer, a battery assembly monitor 910 includes, as a single semiconductor integrated circuit, n cell balancing switches (SW1-SWn) 971-97*n*, a single multiplexer 911, a single ADC 912, and a single signal processing control circuit 913. This semiconductor integrated circuit includes n voltage detection terminals (Ts1-Tsn) 951-95*n*, and n cell balancing terminals (Tc1-Tcn) 961-96*n*. The signal processing control circuit 913 outputs a switch control signal (Sc) 980 and a MUX control signal (Mx) 920. The switch control signal (Sc) 980 is a bundle of cell balancing switch control signals (Sc1-Scn) 981-98*n*.

The battery assembly controller of FIG. 1 measures the voltages Ve of all of the secondary batteries BT and turns on or off any of the cell balancing switches such that all of the secondary battery voltages Ve become approximately equal. In this manner, the battery assembly controller of FIG. 1 equalizes the secondary battery voltages Ve.

In the battery assembly controller of FIG. 1, the voltage detection resistor (Rs) 916 is directly connected to the positive electrode of the secondary battery (BT) 914 with high potential. The voltage detection resistor (Rs) 918 is directly connected to the negative electrode of the secondary battery (BT) 914 with low potential.

In FIG. 1, the detected voltage Vr, which is measured by the ADC 912, is a voltage of a path through which the cell balancing current (Ic) 921 does not flow. Thus, the relation between the detected voltage Vr and the secondary battery voltage Ve is represented by $$Vr=Ve \tag{1}$$

Therefore, the potential difference ΔV between the secondary battery voltage Ve and the detected voltage Vr is $$\Delta V=Ve-Vr=0 \tag{2}$$

In this manner, the detected voltage Vr of the battery assembly controller of FIG. 1 is exactly equal to the secondary battery voltage Ve. Even if there are differences between the cell balancing resistors Rc and the cell balancing currents Ic, the secondary battery voltages Ve can be equalized.

As described above, in this embodiment, the monitoring circuit that monitors the secondary battery voltages Ve is directly connected to positive and negative electrodes of the secondary batteries BT, thereby accurately equalizing the secondary battery voltages Ve.

Figure 2:
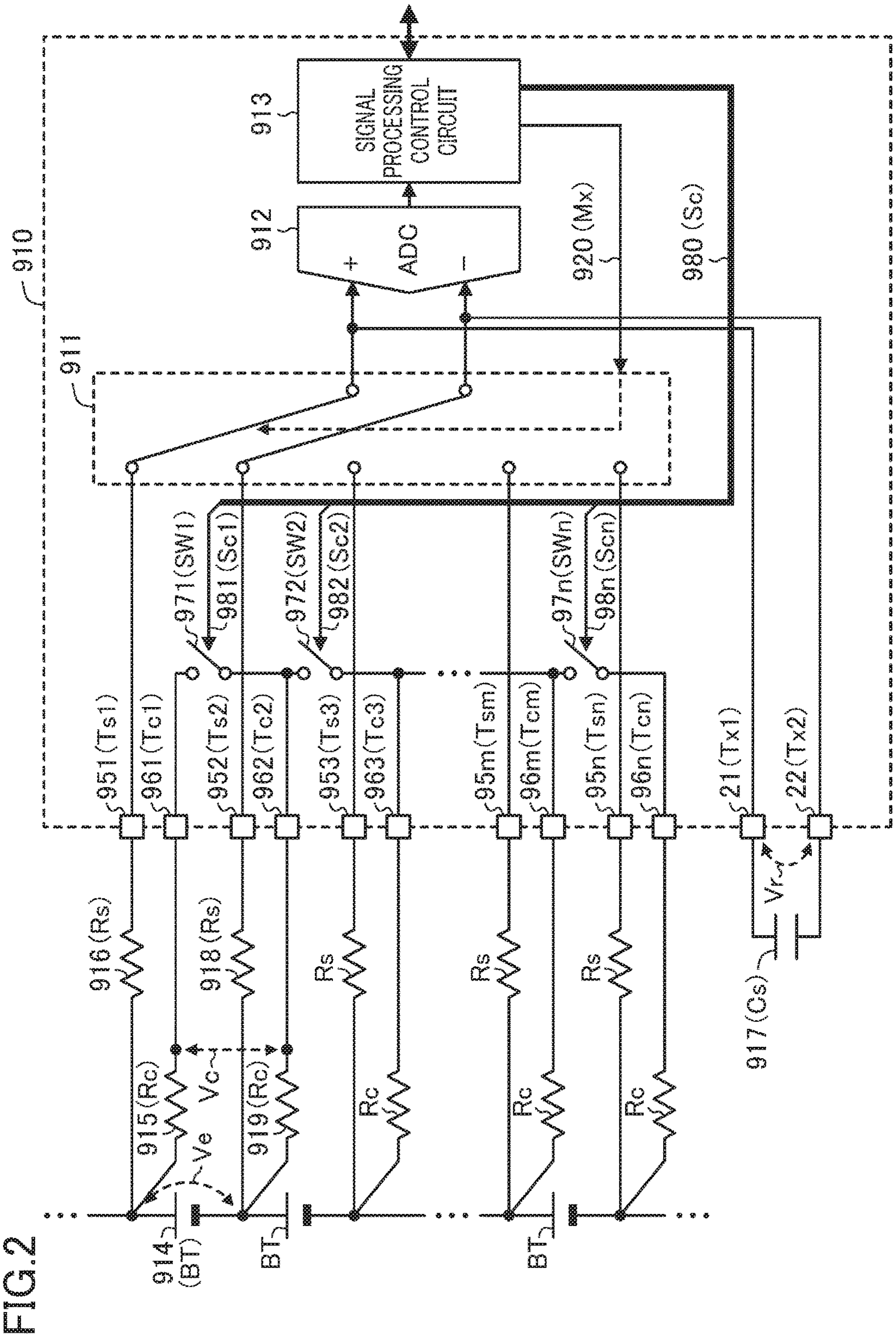
FIG. 2 is a circuit diagram of a first variation of the battery assembly controller of FIG. 1.

FIG. 2 is a circuit diagram of a first variation of the battery assembly controller of FIG. 1. In the battery assembly controller of FIG. 2, only one voltage detection capacitor (Cs) 917 of FIG. 1 is directly connected to an input of the ADC 912. This configuration requires two additional connection terminals (Tx1 and Tx2) 21 and 22 for the voltage detection capacitor Cs. However, only one voltage detection capacitor Cs is needed to constitute a low-pass filter. This increases the advantage of largely reducing the number of the voltage detection capacitors to lower the costs of the battery assembly controller.

Figure 3:
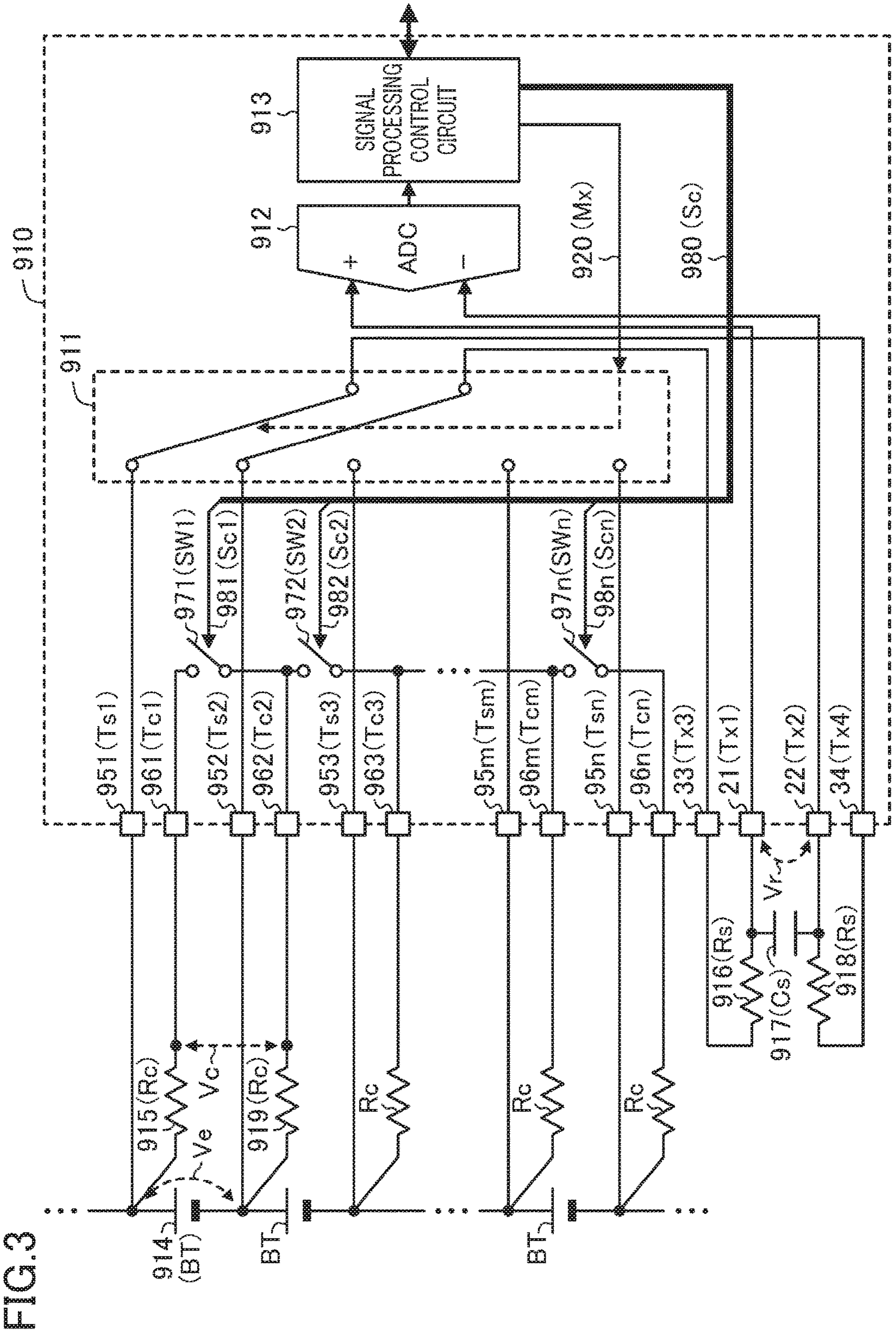
FIG. 3 is a circuit diagram of a second variation of the battery assembly controller of FIG. 1.

FIG. 3 is a circuit diagram of a second variation of the battery assembly controller of FIG. 1. In the battery assembly controller of FIG. 3, only one voltage detection resistor (Rs) 916 of FIG. 2 is directly connected to an input of the positive electrode of the ADC 912. Only one voltage detection resistor (Rs) 918 is directly connected to an input of the negative electrode of the ADC 912. This configuration requires two additional connection terminals (Tx3 and Tx4) 33 and 34 for the voltage detection resistors Rs. However, only two voltage detection resistors Rs are needed to constitute a low-pass filter. This increases the advantage of largely reducing the number of the voltage detection resistors to further lower the costs of the battery assembly controller.

Second Embodiment

Figure 4:
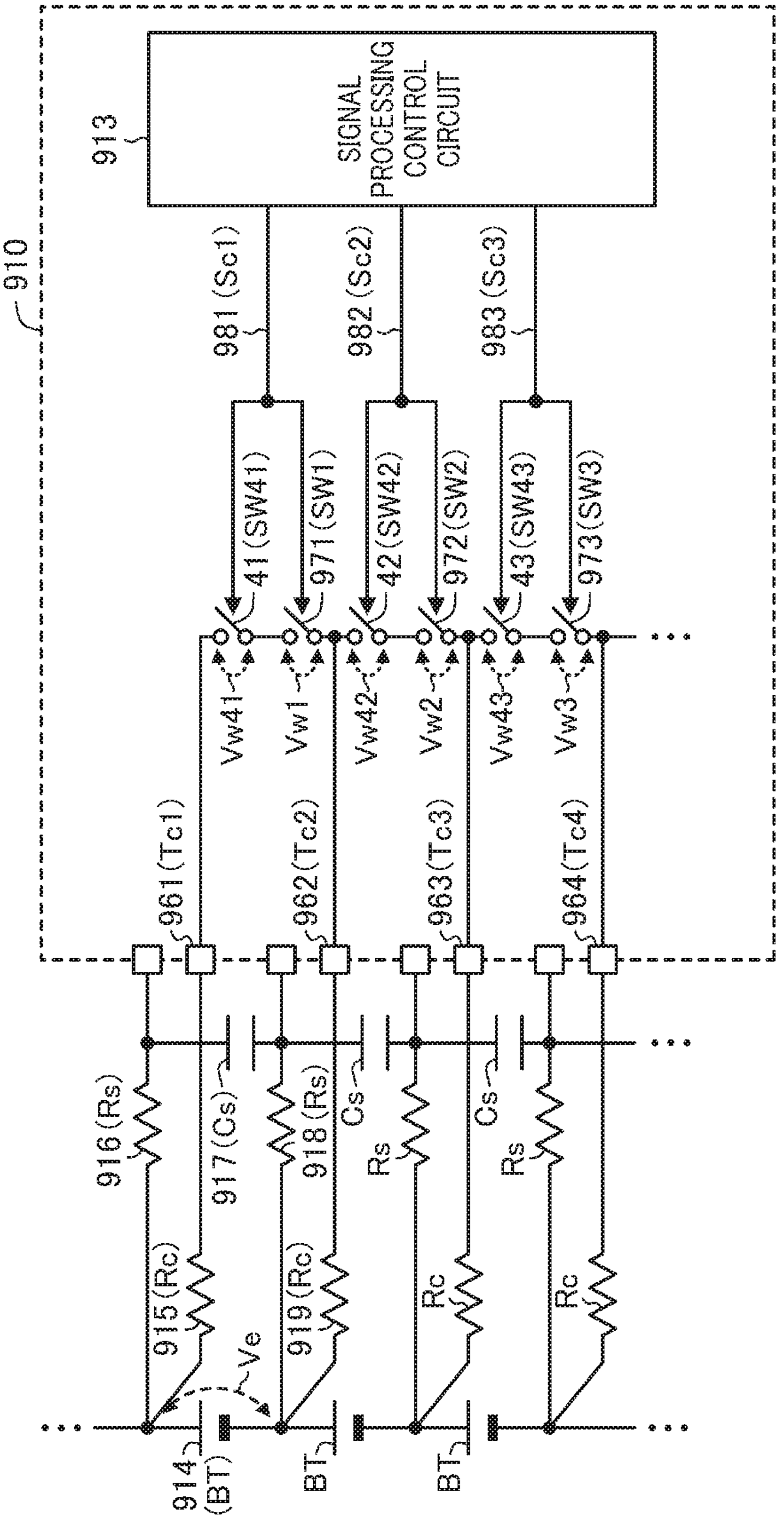
FIG. 4 is a circuit diagram of a battery assembly controller according to a second embodiment.

FIG. 4 is a circuit diagram of a battery assembly controller according to a second embodiment. In the battery assembly controller of FIG. 4, other cell balancing switches (SW41-SW43) 41-43 are connected in series to the cell balancing switches (SW1-SW3) 971-973 of FIG. 1, respectively. The voltages applied to both the terminals of the cell balancing switches (SW1-SW3) 971-973 are referred to as Vw1-Vw3, and the voltages applied to both the terminals of the cell balancing switches (SW41-SW43) 41-43 are referred to as Vw41-Vw43.

For example, a cell balancing switch control signal (Sc2) 982 is applied to turn on the cell balancing switch (SW2) 972 and the cell balancing switch (SW42) 42. Then, the discharge of one of single secondary batteries BT is studied. At this time, since the cell balancing switch (SW2) 972 and the cell balancing switch (SW42) 42 are ON, $$Vw2=Vw42=0 \tag{3}$$

Thus, $$Vw1=Vw3=Vw41=Vw43=0.75\cdot Ve \tag{4}$$

On the other hand, if there are no cell balancing switches (SW41-SW43) 41-43 and the cell balancing switch (SW2) 972 is turned on, $$Vw1=Vw3=1.5\cdot Ve \tag{5}$$

In view of this, the cell balancing switches (SW41-SW43) 41-43 are provided to halve the voltages applied to both the terminals of the cell balancing switches, thereby preventing breakdown of the cell balancing switches.

While, in this embodiment, two switches are connected in series to form each cell balancing switch, three or more switches may be connected in series to form each cell balancing switch.

Figure 5:
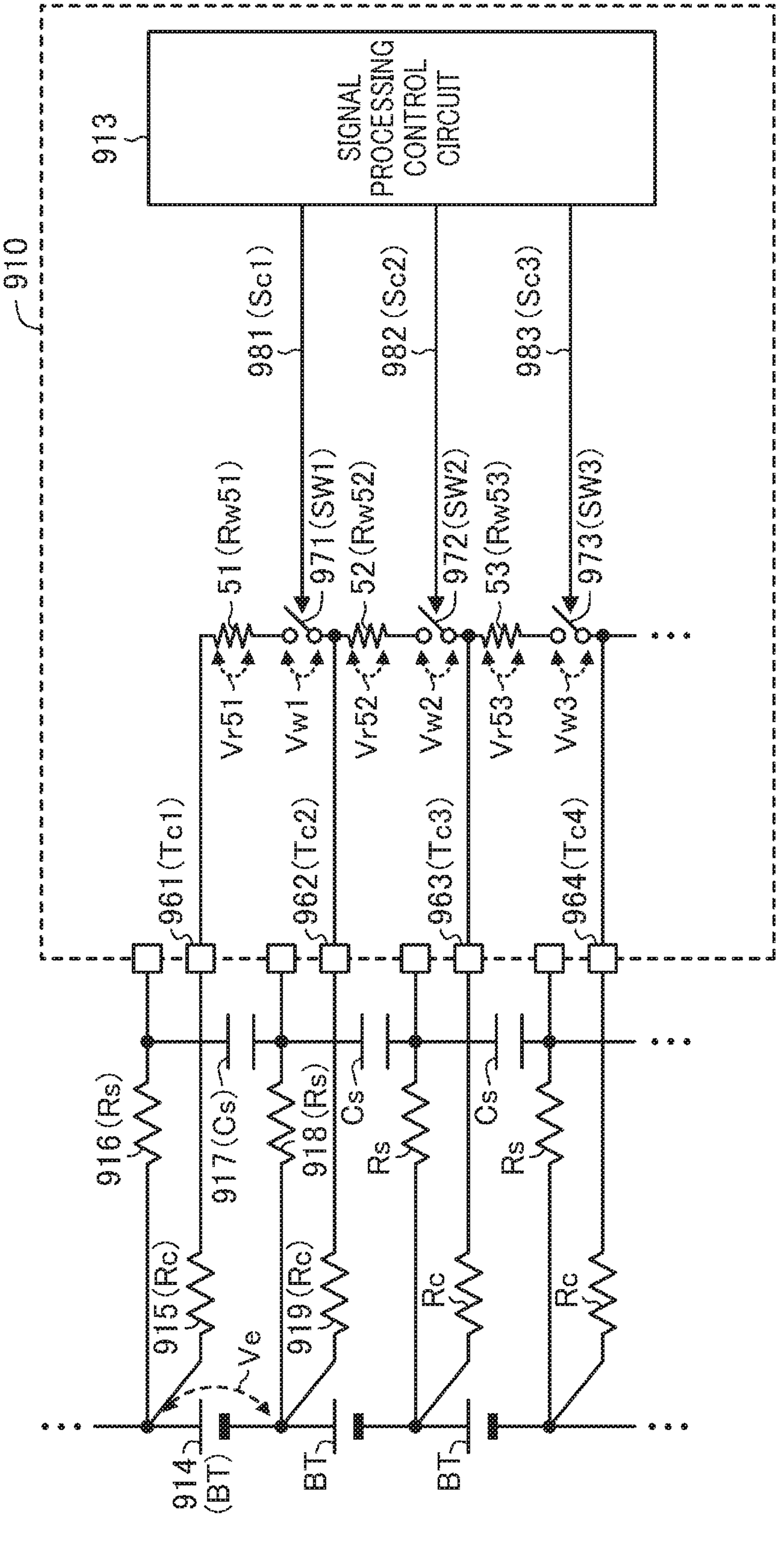
FIG. 5 is a circuit diagram of a variation of the battery assembly controller of FIG. 4.

FIG. 5 is a circuit diagram of a variation of the battery assembly controller of FIG. 4. In the battery assembly controller of FIG. 5, ones of the cell balancing switch pairs of FIG. 4, that is, the switches (SW41-SW43) 41-43 are replaced with cell balancing switch resistors (Rw51-Rw53) 51-53. The voltages applied to both the terminals of the cell balancing switches (SW1-SW3) 971-973 are referred to as Vw1-Vw3. The voltages applied to both the terminals of the cell balancing switch resistors (Rw51-Rw53) 51-53 are referred to as Vr51-Vr53. The cell balancing switch resistors (Rw51-Rw53) 51-53 have the same resistance as the on-resistance of the cell balancing switches (SW1-SW3) 971-973.

Thus, even if the cell balancing switch (SW2) 972 is turned on, the voltages applied to both the terminals of the other cell balancing switches (SW1 and SW3) 971 and 973 and the cell balancing switch resistors (Rw51 and Rw53) 51 and 53 are $$Vw1=Vw3=Vr51=Vr53=0.75\cdot Ve \tag{6}$$

That is, the cell balancing switch resistors (Rw51-Rw53) 51-53 are provided to halve the voltages applied to both the terminals of the cell balancing switches, thereby preventing breakdown of the cell balancing switches.

While, in this embodiment, the cell balancing switch resistors have the same resistance as the on-resistance of the cell balancing switches, the resistance may be higher than or equal to the on-resistance of the cell balancing switches.

Third Embodiment

Figure 6:
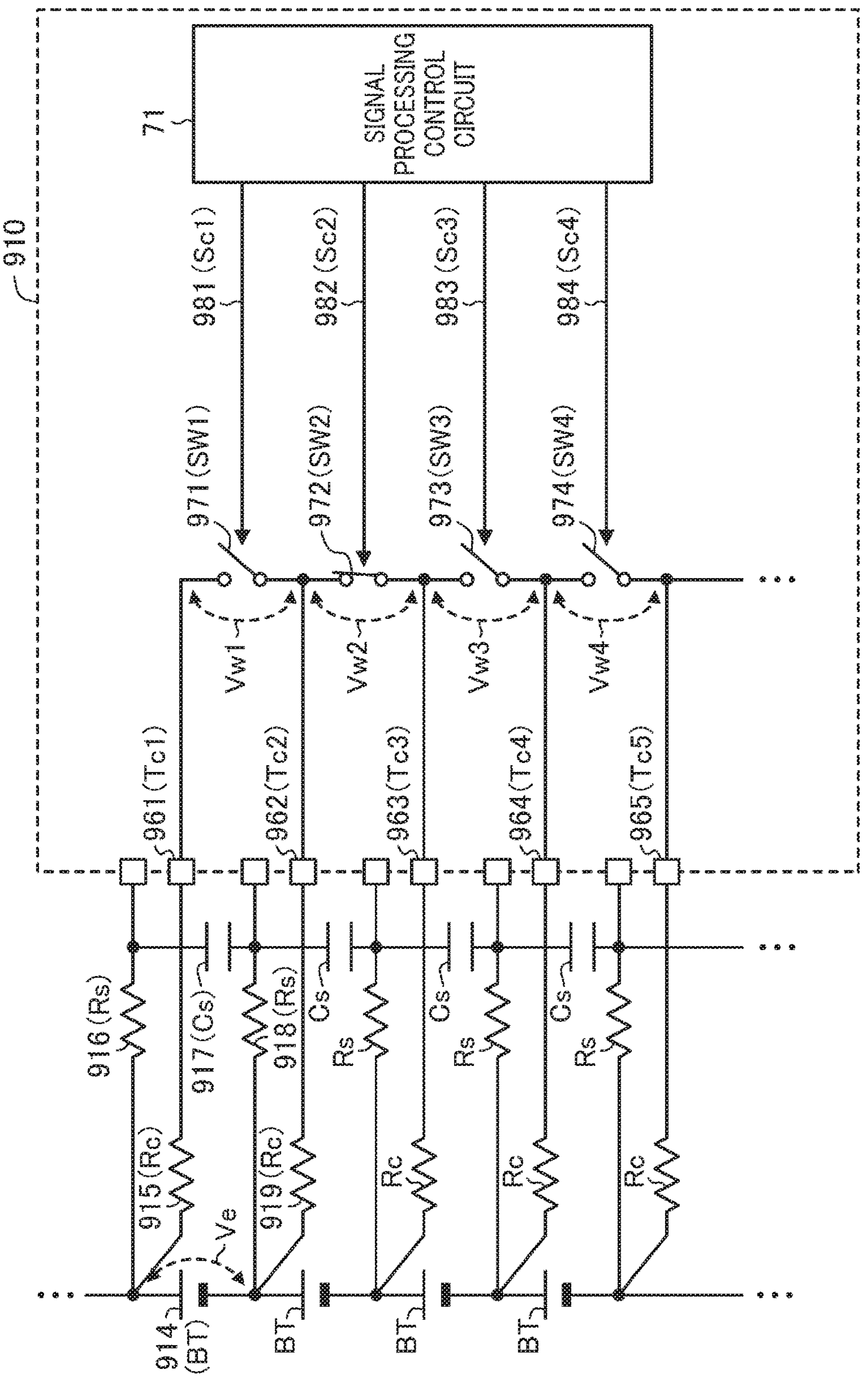
FIG. 6 is a circuit diagram of a battery assembly controller according to a third embodiment.

FIG. 6 is a circuit diagram of a battery assembly controller according to a third embodiment. The battery assembly controller of FIG. 6 includes cell balancing switches (SW1-SW4) 971-974 and a signal processing control circuit 71. Each of the cell balancing switches (SW1-SW4) 971-974 is a single switch. The signal processing control circuit 71 controls discharge not to turn on adjacent ones of the cell balancing switches simultaneously. The voltages applied to both the terminals of the cell balancing switches (SW1-SW4) 971-974 are referred to as Vw1-Vw4.

In FIG. 6, assume that two successive cell balancing switches (SW2 and SW3) 972 and 973 are turned on. Since the cell balancing switches (SW2 and SW3) 972 and 973 are ON, $$Vw2=Vw3=0 \tag{7}$$

$$Vw1=Vw4=2\cdot Ve \tag{8}$$

A double voltage of the secondary battery voltage Ve is applied to both the terminals of the cell balancing switches (SW1 and SW4) 971 and 974.

However, the battery assembly controller of FIG. 6 includes the signal processing control circuit 71 that controls discharge not to turn on adjacent ones of the cell balancing switches simultaneously. Thus, the voltages applied to both the terminals of the cell balancing switches (SW1-SW4) 971-974 are $$Vw1, Vw2, Vw3, Vw4 \leq 1.5\cdot Ve$$

That is, the upper limit of the voltages applied to both the terminals of the cell balancing switches (SW1-SW4) 971-974 is lowered. This configuration prevents breakdown of the cell balancing switches without employing the configurations of the cell balancing switch according to the second embodiment and the variation thereof, thereby reducing the costs of the battery assembly controller.

Figure 7:
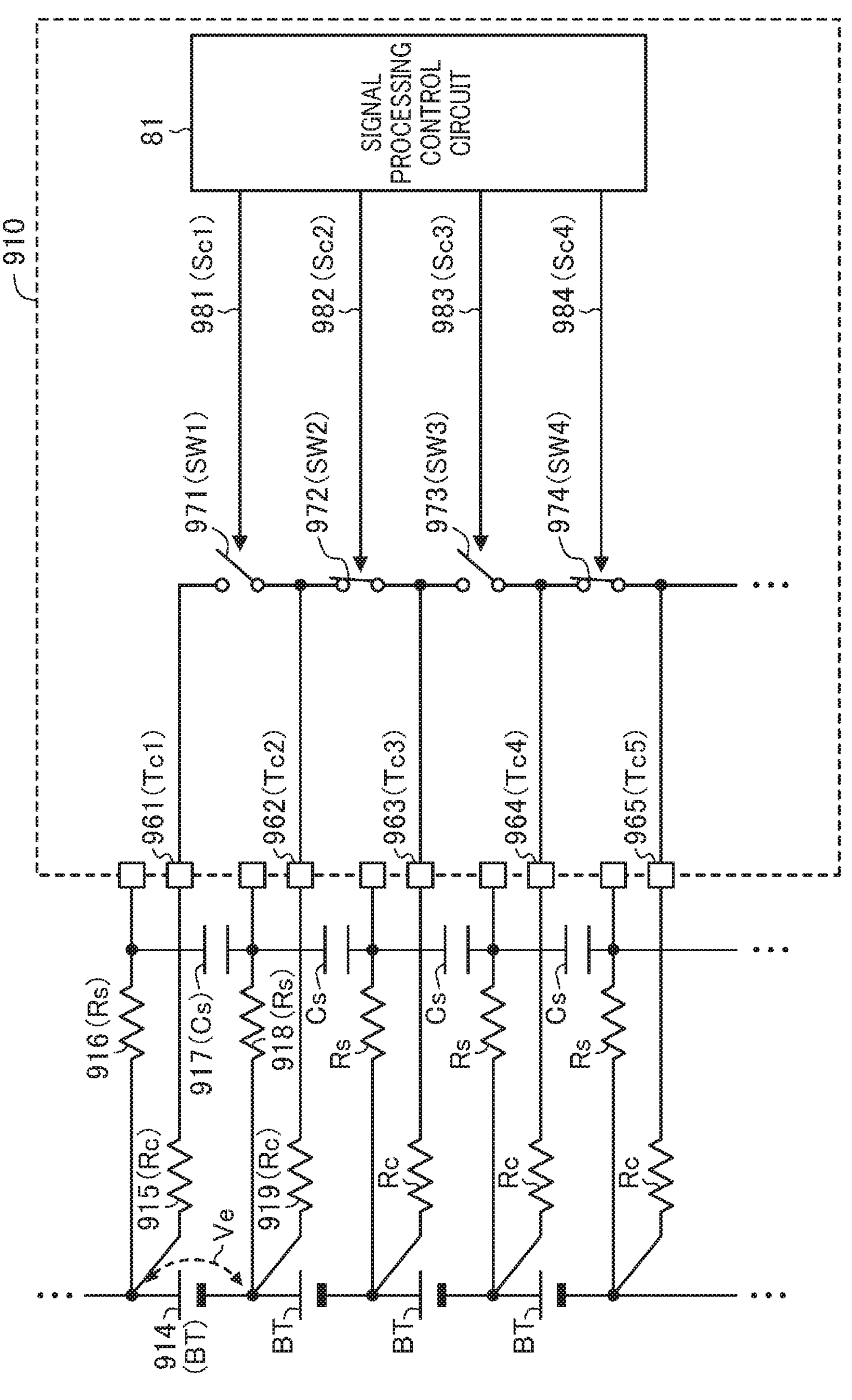
FIG. 7 is a circuit diagram of a variation of the battery assembly controller of FIG. 6.

FIG. 7 is a circuit diagram of a variation of the battery assembly controller of FIG. 6. The battery assembly controller of FIG. 7 has almost the same configuration as that of FIG. 6. The battery assembly controller of FIG. 7 includes a signal processing control circuit 81. Where the cell balancing switches (SW1-SW4) 971-974 are sequentially numbered as 1, 2, 3, . . . , from a high-potential side, the signal processing control circuit 81 controls discharge not to turn on the odd-numbered and even-numbered cell balancing switches simultaneously.

With this configuration, for example, the odd-numbered cell balancing switches are simultaneously turned on and the secondary batteries are discharged, or the even-numbered cell balancing switch are simultaneously turned on and the secondary batteries are discharged. Only two-time discharge enables equalization of all of the secondary battery voltages Ve, thereby enabling high-speed discharge and low power consumption.

Fourth Embodiment

Figure 8:
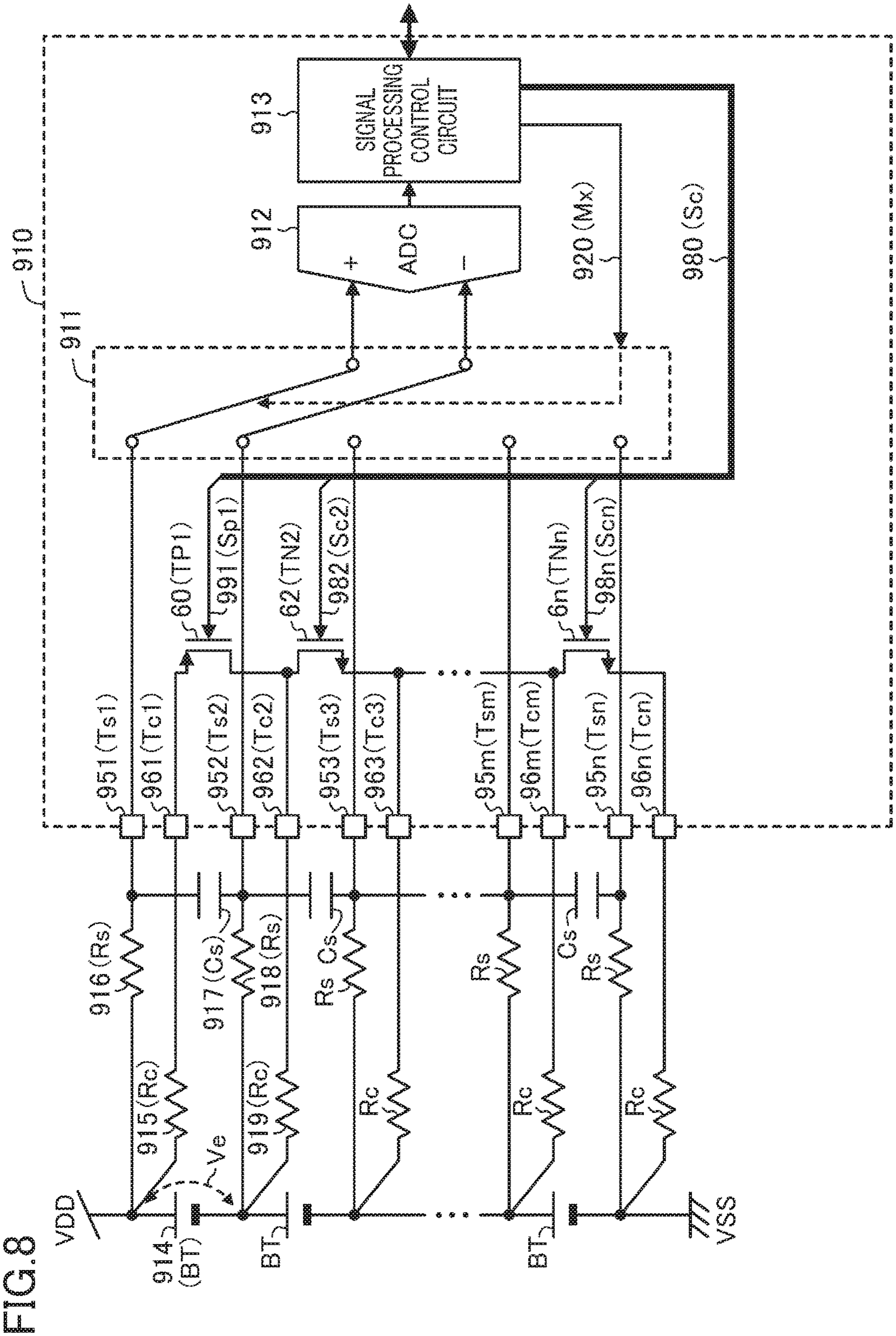
FIG. 8 is a circuit diagram of a battery assembly controller according to a fourth embodiment.

FIG. 8 is a circuit diagram of a battery assembly controller according to a fourth embodiment. In the battery assembly controller of FIG. 8, the cell balancing switch (SW1) 971 with the highest potential in FIG. 1 is a p-channel metal-oxide-semiconductor (MOS) transistor (TP1) 60, and the other cell balancing switches (SW2-SWn) **972-97*n* are n-channel MOS transistors (TN2-TNn) 62-6*n*. The p-channel MOS transistor (TP1) 60 receives a cell balancing switch control signal (Sp1) 991 from the signal processing control circuit 913**.

Since the cell balancing switch with the highest potential is the p-channel MOS transistor (TP1) 60, even if the secondary battery voltage Ve is low, the gate-source voltage of the p-channel MOS transistor (TP1) 60 can be higher than or equal to the secondary battery voltage Ve. This reduces the on-resistance of the p-channel MOS transistor (TP1) 60, thereby enabling high-speed operation.

In this embodiment, only the cell balancing switch (SW1 in FIG. 1) with the highest potential is the p-channel MOS transistor. However, as long as the cell balancing switch (SWn in FIG. 1) with the lowest potential is the n-channel MOS transistor, the other cell balancing switches (SW2-SWn−1 in FIG. 1) may be p-channel MOS transistors or n-channel MOS transistors.

Figure 9:
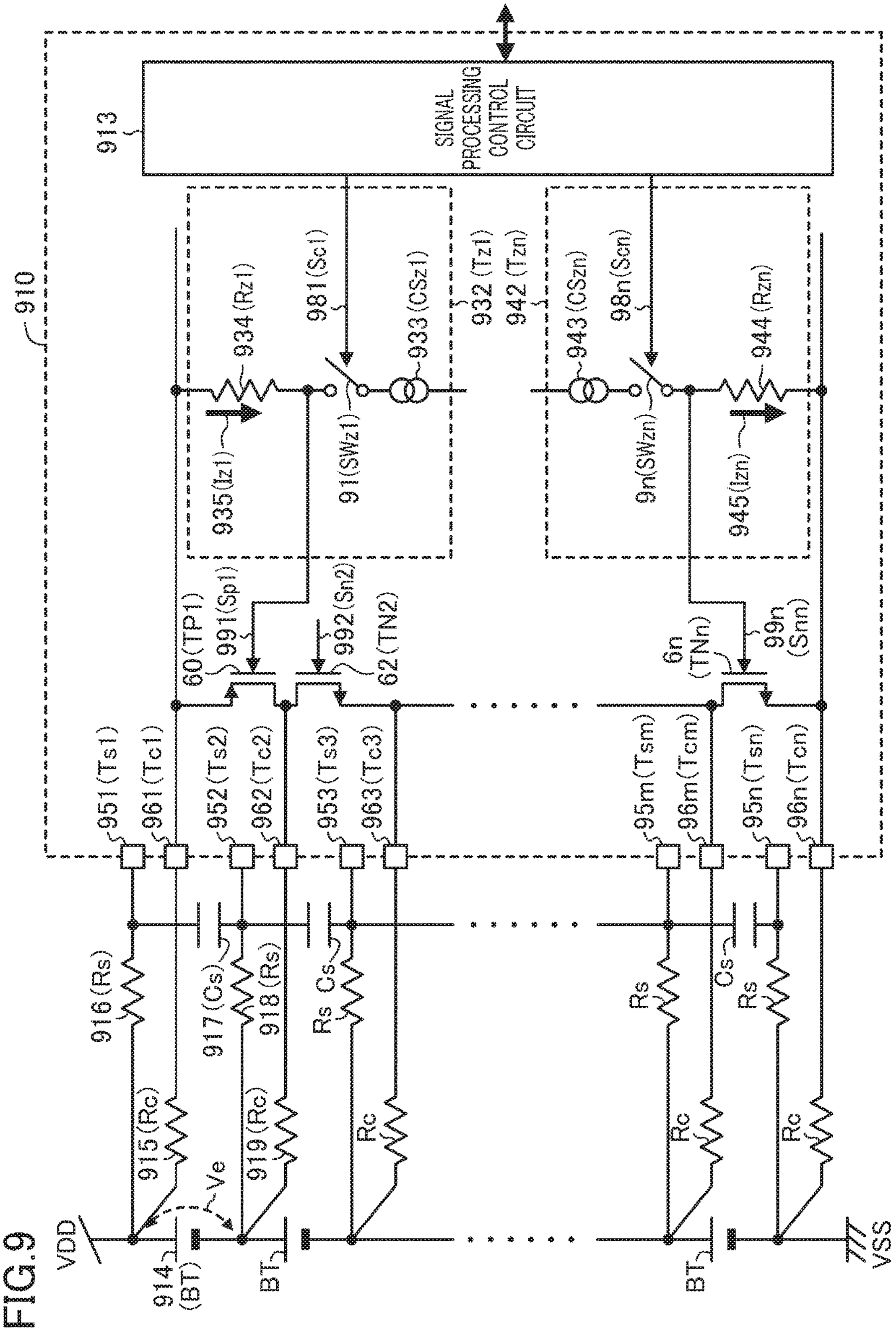
FIG. 9 is a circuit diagram of a first variation of the battery assembly controller of FIG. 8.

FIG. 9 is a circuit diagram of a first variation of the battery assembly controller of FIG. 8. In FIG. 9, where n is an integer, a gate control signal (Snn) **99*n* of an n-channel MOS transistor (TNn) 6*n*, which is the cell balancing switch with the lowest potential, is connected or coupled to a current supply resistor (Rzn) 944 in a gate signal control circuit (Tzn) 942. A current supply connection control switch (SWzn) 9*n* controls whether or not to connect a current supply (CSzn) 943 to this connecting point. A current (Izn) 945 flows through the current supply resistor (Rzn) 944. On the other hand, a gate control signal (Sp1) 991 of a p-channel MOS transistor (TP1) 60, which is the cell balancing switch with the highest potential, is connected or coupled to a current supply resistor (Rz1) 934 in a gate signal control circuit (Tz1) 932. A current supply connection control switch (SWz1) 91 controls whether or not to connect a current supply (CSz1) 933 to this connecting point. A current (Iz1) 935 flows through the current supply resistor (Rz1) 934**.

Similarly, connection of the other cell balancing switches is controlled with any of the configurations described above, depending on whether the cell balancing switch is an n-channel MOS transistor or a p-channel MOS transistor. In FIG. 9, an example is described where only the cell balancing switch with the highest potential is a p-channel MOS transistor. All of the other cell balancing switches are n-channel MOS transistors (TN2-TNn) **62-6*n*. These n-channel MOS transistors (TN2-TNn) 62-6*n* receive gate control signals (Sn2-Snn) 992-99*n*, respectively, from circuits being the same as or similar to the gate signal control circuit (Tzn) 942**.

With this configuration, when one of the cell balancing switches is OFF, corresponding one of the current supply connection control switches (SWz1-SWzn) **91-9*n*** is turned off such that the current supply current is zero. When the secondary batteries BT are not discharged, current consumption becomes zero, which leads to reduction in current consumption in discharging.

Figure 10:
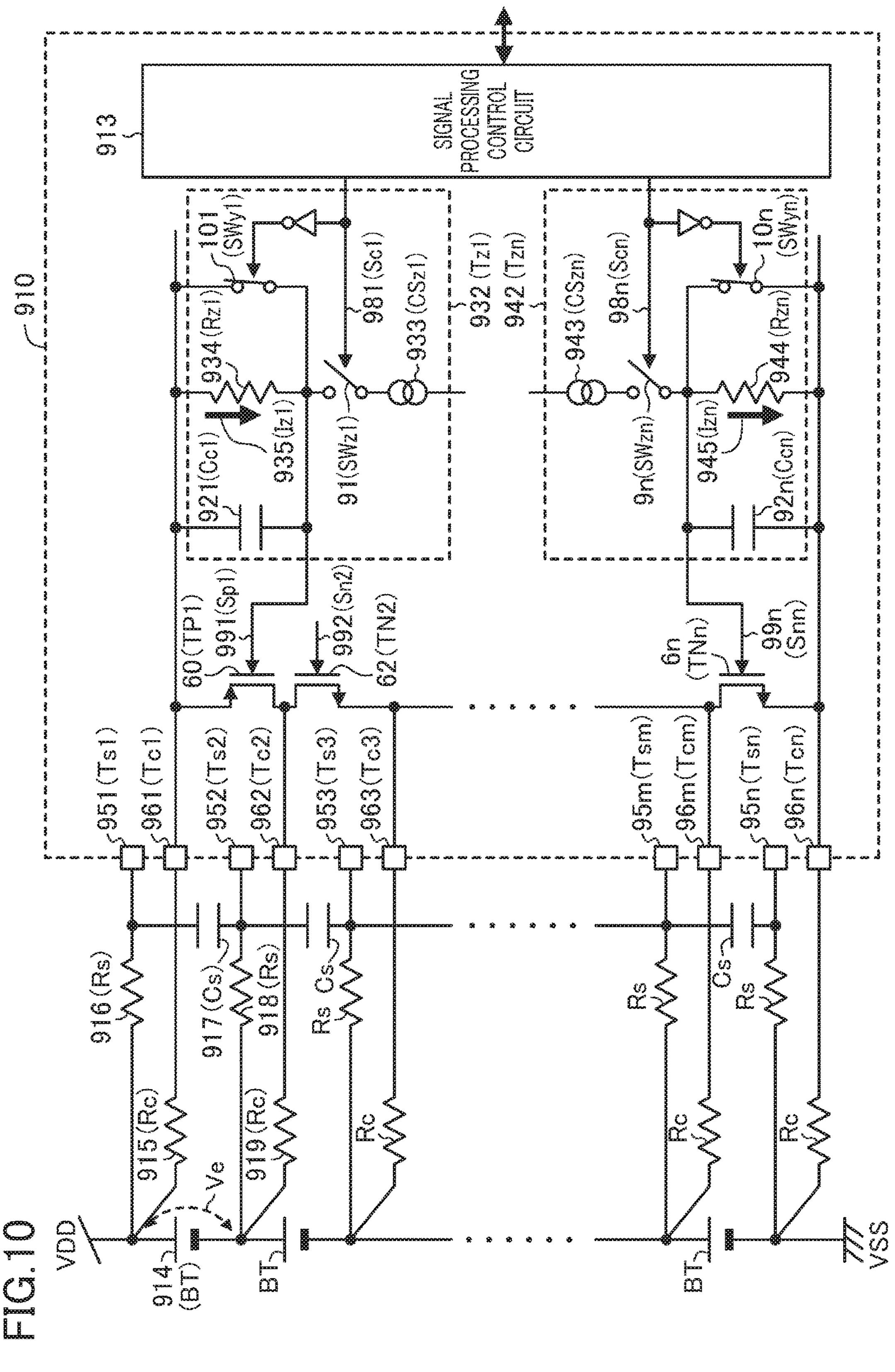
FIG. 10 is a circuit diagram of a second variation of the battery assembly controller of FIG. 8.

FIG. 10 is a circuit diagram of a second variation of the battery assembly controller of FIG. 8. In the battery assembly controller of FIG. 10, where n is an integer, a gate parasitic capacitance (Ccn) **92*n* and a gate control signal (Snn) 99*n* of an n-channel MOS transistor (TNn) 6*n*, which is the cell balancing switch with lowest potential, are controlled by a gate control switch (SWyn) 10*n*. The gate control switch (SWyn) 10*n* forcibly fixes potential to a low level, when a cell balancing switch is OFF. A gate parasitic capacitance (Cc1) 921 and a gate control signal (Sp1) 991 of a p-channel MOS transistor (TP1) 60, which is the cell balancing switch with highest potential, are controlled by a gate control switch (SWy1) 101. The gate control switch (SWy1) 101** forcibly fixes potential to a high level, when a cell balancing switch is OFF.

Similarly, connection of the other cell balancing switches is controlled with any of the configurations described above, depending on whether the cell balancing switch is an n-channel MOS transistor or a p-channel MOS transistor.

This configuration allows for immediately stopping discharge, when a cell balancing switch is turned off from an on state, thereby accurately and evenly discharging the secondary battery voltages Ve.

Figure 11:
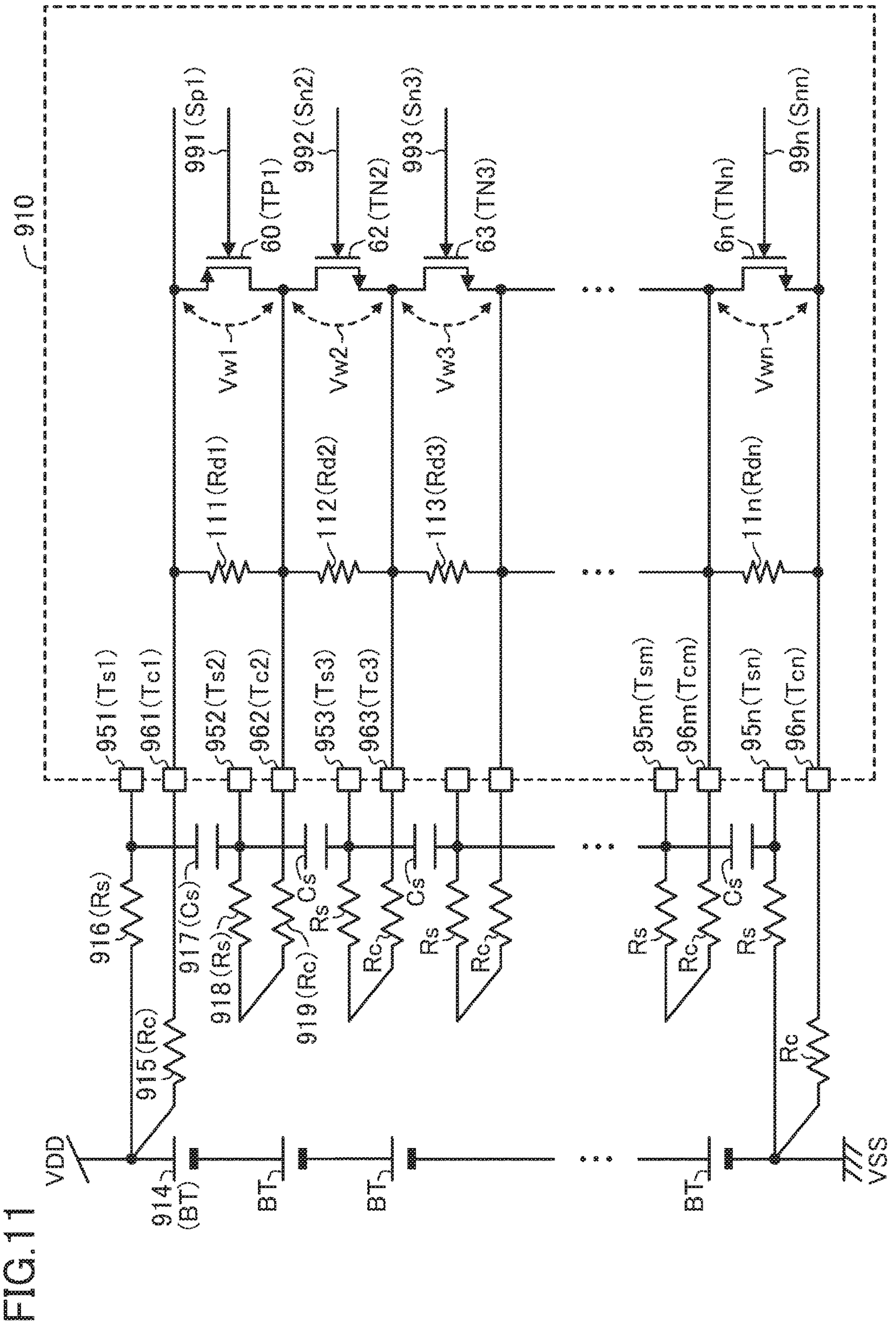
FIG. 11 is a circuit diagram of a third variation of the battery assembly controller of FIG. 8.

FIG. 11 is a circuit diagram of a third variation of the battery assembly controller of FIG. 8. In the battery assembly controller of FIG. 11, where n is an integer, anti-breakdown resistors (Rd1-Rdn) 111-11*n* are added in parallel to the cell balancing switches.

Assume that a battery assembly of a plurality of series-connected batteries is inserted into a secondary battery train, and the positive electrode of a secondary battery with high potential and the negative electrode of a secondary battery with low potential are connected or coupled to the battery assembly monitor 910 depending on conditions. Even in this case, voltages almost equal to the secondary battery voltage Ve are applied to internal cell balancing switches, thereby preventing breakdown of the cell balancing switches.

Figure 12:
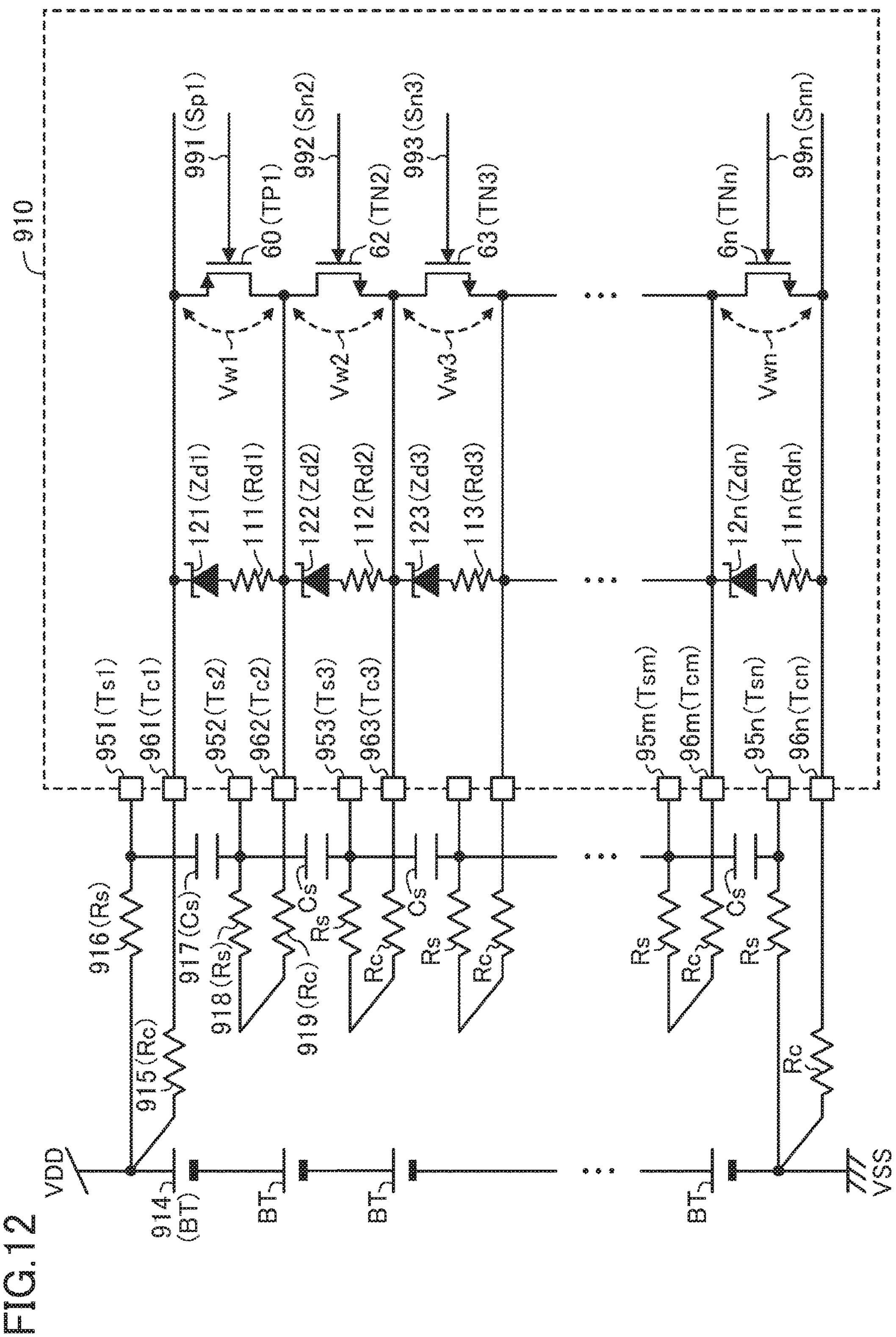
FIG. 12 is a circuit diagram of a fourth variation of the battery assembly controller of FIG. 8.

FIG. 12 is a circuit diagram of a fourth variation of the battery assembly controller of FIG. 8. In the battery assembly controller of FIG. 12, where n is an integer, Zener diodes (Zd1-Zdn) 121-12*n* are added in series to the anti-breakdown resistors (Rd1-Rdn) 111-11*n* of FIG. 11.

With this configuration, if the secondary battery voltage Ve is lower than or equal to the breakdown voltages of the Zener diodes, only a small current flows to minimize current consumption of an anti-breakdown circuit, which leads to low current consumption of the battery assembly controller.

Note that the elements in the first to fourth embodiments and their variations may be combined as appropriate.

The battery assembly controller according to the present disclosure is applicable to wide range of products such as electric vehicles, hybrid vehicles, trains, vessels, and laptops, which include a plurality of series-connected batteries.

What is claimed is:

1. A battery assembly controller controlling terminal voltages of a plurality of series-connected secondary batteries to be equal, the controller comprising:

a discharge circuit selectively reducing the terminal voltages of the secondary batteries; and a monitoring circuit directly connected to positive and negative electrodes of the secondary batteries to monitor the terminal voltages of the secondary batteries, wherein the discharge circuit includes:

a plurality of switches, each being connected to positive and negative electrodes of associated one of the secondary batteries, and a control circuit controlling not to turn on odd-numbered and even-numbered switches simultaneously, where the switches are sequentially numbered as 1, 2, 3, . . . , from a high-potential side, each of the switches is a MOS transistor, and the discharge circuit further includes:

a plurality of resistors, each being connected between a gate and a source of one of the MOS transistors, a plurality of current supplies, and a plurality of other switches, each being connected between the gate of one of the MOS transistors and associated one of the current supplies.

2. The battery assembly controller of claim 1, wherein the monitoring circuit includes a filtering capacitor switchably connected to the secondary batteries.

3. The battery assembly controller of claim 1, wherein the monitoring circuit includes a filtering capacitor and a resistor switchably connected to the secondary batteries.

4. The battery assembly controller of claim 1, wherein each of the switches includes a plurality of sub-switches connected in series.

5. The battery assembly controller of claim 1, wherein each of the switches includes a sub-switch and a resistor, which are connected in series.

6. The battery assembly controller of claim 1, wherein the control circuit controls not to turn on adjacent ones of the switches simultaneously.

7. The battery assembly controller of claim 1, wherein one of the switches with highest potential is a p-channel MOS transistor, and one of the switches with lowest potential is an n-channel MOS transistor.

8. The battery assembly controller of claim 1, wherein the discharge circuit further includes a plurality of short-circuit switches, each being connected between a gate and a source of one of the MOS transistors.

9. The battery assembly controller of claim 1, wherein the discharge circuit further includes a plurality of resistors, each being connected in parallel to associated one of the switches.

10. The battery assembly controller of claim 9, wherein the discharge circuit further includes a plurality of Zener diodes, each being connected in series to associated one of the resistors.

* * * * *